United States Patent [19]
Wilson, Jr. et al.

[11] Patent Number: 6,055,656
[45] Date of Patent: Apr. 25, 2000

[54] CONTROL REGISTER BUS ACCESS THROUGH A STANDARDIZED TEST ACCESS PORT

[75] Inventors: James A. Wilson, Jr., Portland, Oreg.; Anthony C. Miller, Gilbert, Ariz.; Michael W. Rhodehamel, Beaverton, Oreg.; Adrian Carbine, Hillsboro, Oreg.; Derek B. I. Feltham, Portland, Oreg.; Sumeet Agrawal, Beaverton, Oreg.

[73] Assignee: Intel Corporation, Santa Clara, Calif.

[21] Appl. No.: 08/434,163

[22] Filed: May 2, 1995

[51] Int. Cl.[7] .................................................. G01R 31/28
[52] U.S. Cl. ............................................................ 714/724
[58] Field of Search ................................ 371/22.1, 22.3, 371/22.5, 22.6

[56] References Cited

U.S. PATENT DOCUMENTS

| | | | |
|---|---|---|---|
| 5,329,471 | 7/1994 | Swoboda et al. | 371/16.2 |
| 5,448,576 | 9/1995 | Russell | 371/22.3 |
| 5,459,737 | 10/1995 | Andrews | 371/22.5 |

OTHER PUBLICATIONS

"IEEE Standard Test Access Port and Boundary–Scan Architecture", IEEE, May 21, 1990. IEEE Std 1149.1 –1990.
"Pentium™ Family User's Manual" vol. 1: Data Book, Intel Corporation, 1994 pp. 11–1 to 11–14.

*Primary Examiner*—Christine Trinh L. Tu
*Attorney, Agent, or Firm*—Blakely, Sokoloff, Taylor & Zafman LLP

[57] ABSTRACT

A scheme for accessing a control register bus and control registers of a microprocessor through a test access port which is configured to an established testing standard. A test access port (TAP) of a microprocessor is configured to communicate serially based on a technique specified in the IEEE 1149.1 standard. External serial instructions are converted for parallel transfer to provide control signals for accessing the internal structures. Serial address and data signals are also converted for parallel transfer to access internal structures on a control register bus and parallel outputs are converted to serial format for external output. By permitting external access to low level internal bus architecture, system testing and debug can be performed by utilizing external programming.

10 Claims, 2 Drawing Sheets

CONTROL REGISTER BUS ACCESS THROUGH A STANDARDIZED TEST ACCESS PORT

BACKGROUND OF THE INVENTION

1. Field of the Invention

The present invention relates to the field of microprocessors and, more particularly, to a technique for providing internal access through a standardized test access port.

2. Prior Art

The use of testing devices and test methods for performing diagnostics on a product is well known. Simple "bed-of-nails" fixtures to complex emulators have been devised, depending on the purpose and the product being tested. In the area of microprocessors and other complex integrated devices, testing includes the use of software routines to perform operations for validating the product. In some instances, these testing routines are used not only for diagnostics, but for development of further design modifications.

In the testing of microprocessors, diagnostic routines are utilized to determine a response of a processor to certain commands or instructions. Typically, the test routines will compare the actual response (for example, an output signal onto a bus) to a predicted response to determine if an error condition has occurred. If an error has occurred, the testing routine can generate other commands to determine the cause of the fault. Although the concept is simple, in practice there are a variety of ways to test microprocessors and other integrated circuit devices. For example, in testing internal structure of a microprocessor, diagnostic instructions are included in the microcode and these instructions are executed to perform the test.

Since there are numerous techniques available, the electronic industry has standardized approaches to testing electronic devices, including integrated circuits. One standard defines the use of a test access port (TAP) and boundary-scan architecture for digital integrated circuits. This standard was developed by a Joint Test Action Group (JTAG) and has been accepted by The Institute of Electrical and Electronics Engineers (IEEE) and is commonly referred to as IEEE Standard 1149.1 (or JTAG 1149.1). The IEEE 1149.1 Standard is also recognized as an American National Standard (ANSI). The requirements and specifications of this standard are described fully in a publication entitled "IEEE Standard Test Access Port and Boundary-Scan Architecture" as related to IEEE Standard 1149.1. The circuitry defined by this standard allows test instructions and associated test data to be fed into a component and, subsequently, allows the results of execution of such instructions to be read out. The information is communicated in a serial format. The TAP is usually pin-based and used for checking pin functionality and board-level connectivity.

TAP commands can be extended to cover internal circuitry in addition to pins. An extension of this technique would be to connect it to a serial scan chain, as might be used in a fully scanned design, or as in a scanout. Furthermore, the testing standard can be implemented in testing microprocessors. For example, a specifically designated TAP was used in a Pentium™ microprocessor manufactured by Intel Corporation in order to allow for IEEE Standard 1149.1 implementation. Although the TAP was available on the Pentium microprocessor, the architecture was never extended to reach control registers in the internal core of the microprocessor "chip." It would be advantageous to use test signals through the TAP to access internal control registers by accessing the control register bus(es), instead of relying solely on the execution of microcode to perform diagnostics. Thus, the TAP access would allow programming flexibility for proprietary (and non-proprietary, if desired) access to the internal microarchitecture of a microprocessor.

SUMMARY OF THE INVENTION

The present invention describes a scheme for accessing a control register bus and control registers of a microprocessor through a test access port which is configured to an established testing standard. A test access port (TAP) of a microprocessor is configured to communicate serially as specified in the IEEE 1149.1 standard. Two private instructions in the TAP provide for a control register unit (CRU) to access one of several pieces of internal parallel data path which are generally accessed by microcode only.

Serial information conveyed to the TAP is serially loaded into a shift register in the CRU for subsequent parallel data transfer. External instructions are loaded into an instruction register in the TAP for conveying instructions to an instruction decode and control logic unit, which in turn generates control signals sent to the CRU. Address, write/read and data signals (for write operations) to the TAP are routed to the shift register in the CRU. These address, write/read and data signals are then placed onto control register buses for accessing a device on the bus for a "write" operation. The device is typically a control register of the microprocessor. For a "read" operation, two TAP instructions are needed, one to read information from a device (typically a control register) to the CRU shift register and the second to read information out from the CRU shift register in a serial fashion. The read and write accesses are generally performed at full processor speed.

By permitting external access to low level internal bus architecture, system testing and debug can be performed by utilizing external programming. Such access allows flexibility in that testing routines for such low level structures need not rely on microcode alone. Further, due to the serial input/output from the TAP, minimum additional die area is required and new pins are not needed to place the additional circuitry on the microprocessor chip.

External access to internal low level structures of a microprocessor allows for flexibility in performing diagnostics on a microprocessor which ultimately reduces time required to test and debug the microprocessor. Savings in time translates into savings in cost.

DETAILED DESCRIPTION OF THE PREFERRED EMBODIMENT

A scheme for accessing a control register bus and control registers of a microprocessor through a test access port using an established testing standard is described. In the following description, numerous specific details are set forth, such as specific registers, signal names, specific number of bits associated with address and data signals, etc., in order to provide a thorough understanding of the present invention. However, it will be obvious to one skilled in the art that the present invention may be practiced without these specific details. In other instances, well known techniques and structures have not been described in detail in order not to unnecessarily obscure the present invention. It is to be noted that a preferred embodiment of the present invention is described in reference to a specific IEEE standard, however, it is readily understood that other embodiments can be designed and implemented using other standards without departing from the spirit and scope of the present invention.

The present invention utilizes a test access port (TAP) for communicating information in serial format in order to implement a routine for testing digital integrated circuits. The particular TAP described is the afore-mentioned IEEE Standard 1149.1 (or JTAG 1149.1), which provides for boundary-scan techniques, as well as certain defined instructions, to implement the architecture. Thus, the present invention is described in reference to the IEEE 1149.1 standard. However, it is appreciated that a variety of different diagnostic and/or design routines can be readily adapted using a variety of different port designs utilized on an integrated circuit device. Furthermore, it is appreciated that the present invention is described as implemented in a microprocessor, but such implementation can be readily extended to other integrated circuit devices having internal data paths without departing from the spirit and scope of the present invention.

Figure 1:
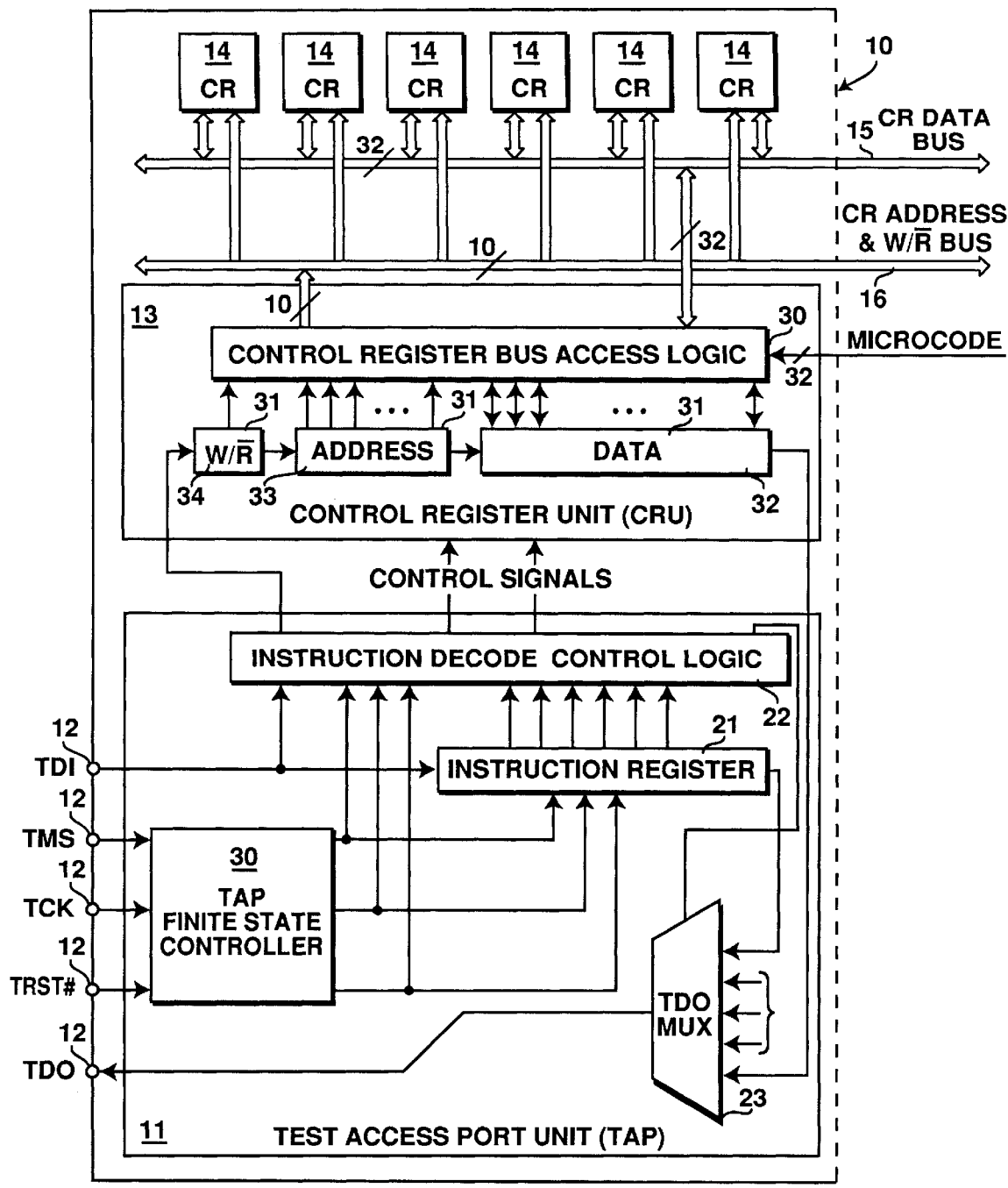
FIG. 1 is a block schematic diagram showing a test access port and control register unit of the present invention for accessing control registers of a microprocessor.

Referring to FIG. 1, a circuit block diagram for practicing the present invention is shown. The various components shown in FIG. 1 are implemented within a microprocessor 10. Only those components associated with the practice of the present invention are shown. The remaining portions of the microprocessor 10 are figuratively located beyond the dotted line forming the right edge of the drawing in FIG. 1. As noted (but amplified here), the particular test standard utilized in the preferred embodiment is the IEEE 1149.1 standard, which is described in the aforementioned publication entitled "IEEE Standard Test Access Port and Boundary-Scan Architecture." The IEEE 1149.1 standard defines a test architecture based on a boundary scan and specific details for implementing it. Some of these details include signal requirements, signal connections, test logic requirements, required instructions and optional design features. Furthermore, logic circuitry examples are provided in this publication, although there are a variety of ways to implement the various logic required. Finally, while it is appreciated that this publication (or similar publication specifying the IEEE 1149.1 standard) is a necessary resource to implement the requirements of the IEEE 1149.1 standard, it is not essential to the understanding of the present invention.

The IEEE 1149.1 standard requires the presence of a test access port (TAP), a TAP controller, an instruction register and at least two test registers. One test register is identified as a bypass register and the second is identified as a boundary-scan register. The bypass register provides a minimum length serial path for the movement of test data between input and output of a device. The bypass register is used when no other test register is selected for the device. The boundary-scan register is used for testing of board interconnections and detecting typical production defects which are external to the microprocessor. The bypass and boundary-scan registers are not shown in FIG. 1, since these registers are not critical to the understanding or practice of the present invention.

Additionally, the IEEE 1149.1 standard specifies optional test registers which allow access to design-specific test support features of the microprocessor. The register(s) need not be intended for public use or access, but can be made so. The present invention utilizes this optional register specification to permit test access to a control register bus and to control registers of the microprocessor 10. Thus, a particular embodiment for the accessing of control registers of the microprocessor 10 for the purpose of testing the microprocessor 10 by using the requirements enumerated in the IEEE 1149.1 standard is shown in FIG. 1.

In FIG. 1, a test access port unit (TAP) 11 is shown coupled to external connections 12 for interfacing signals specified by the IEEE 1149.1 standard. The signals are identified as TDI, TDO, TMS, TCK and TRST# (# indicates that it is active on low state of the signal). TDI is the serial test data input signal to TAP 11. TDO is the serial test data output signal from TAP 11. TCK provides the clocking signal to TAP 11. TMS is a serial test mode select input signal for selecting a mode of operation for TAP 11. TRST# is a test reset input signal for providing asynchronous initialization of TAP 11 (specifically, the TAP controller).

Logic components within TAP 11 are TAP controller 20, instruction register 21, instruction decode control logic 22 and TDO multiplexer (mux) 23. The input signal TDI is coupled as an input to the instruction register 21, which is a shift register for shifting in the serial input signal. The TDI signal is also coupled to a control register unit (CRU) 13 through the instruction decode control logic 22. The output of mux 23 is coupled as the output signal TDO. The mux 23 is controlled by a control signal from the instruction decode control logic 22. Also as noted in FIG. 1, the instruction register 21 is coupled as an input to mux 23. Thus, as the next instruction is shifted in to register 21, the last instruction is sent serially out to mux 23, which then can be sent out as output TDO. This technique allows serial connection of multiple JTAG ports in a system. Furthermore, other inputs to mux 23 are shown in FIG. 1, but are not related to the practice of the present invention.

The TMS, TCK and TRST# control signals are coupled to the TAP controller 20, which is a synchronous finite state machine that responds to changes to the TMS and TCK signals and generates control signals to other components of TAP 11. In the preferred embodiment, three control signals (which are representative of TMS, TCK and TRST#) are generated from the TAP controller 20. It is appreciated that the design of TAP controller 20, as well as its control outputs, are a design choice and a variety of circuits can be utilized to provide the control outputs.

The instruction register 21 allows for serial input to be converted to a parallel signal. The instruction register 21 is used to couple in the serial TDI signal, if the TDI information is an instruction. The instruction register 21 retains the currently active instruction until its contents are changed by the next instruction received. Once the instruction register 21 shifts in the correct number of TDI input bits, register 21 (under control of TAP controller 20) couples a parallel output to instruction decode and control logic unit 22. In the preferred embodiment, the instruction "word" has been set to six bits. Thus, when six TDI bits forming an instruction "word" are received by register 21, the parallel output is coupled to logic 22. It is noted that the 6-bit length of the instruction "word" is a design choice.

Logic 22 then decodes the instruction and generates control signals that are coupled to the CRU 13 and elsewhere, such as mux 23. Generally, the decoded instruction is utilized to control the CRU 13 to perform a particular test. In this particular instance, the decoded instruction is used to control the CRU 13 to read from or write to control registers 14.

As noted earlier, the CRU 13 is a test register unit designed specifically for the purpose of allowing access to control registers 14 of the microprocessor 10. CRU 13 is coupled to control registers 14 by a control register (CR) data bus 15 and CR address W/R# bus 16. In the preferred embodiment, bus 15 is a parallel, bi-directional 32-bit bus, which transfers 32-bit data between the CRU 13 and control registers 14. Also in the preferred embodiment, bus 16 is a parallel, unidirectional 10-bit bus transferring 9-bit address information and a write/read (W/R#) status bit from CRU 13 to registers 14. The buses 15 and 16 are high level buses internal to the microprocessor 10 and are also utilized to couple microcode to the control registers 14. It is appreciated that the number of bits for buses 15 and 16 is a design choice.

Figure 2:
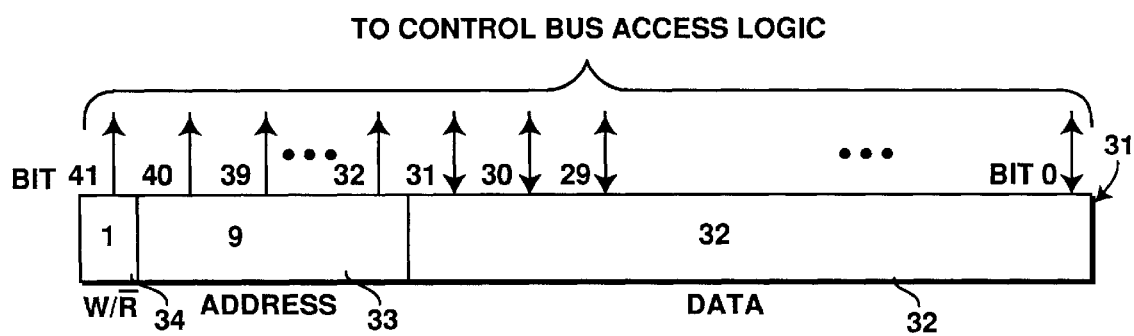
FIG. 2 is a diagram showing bit designation in a shift register in the control register unit shown in FIG. 1.

The CRU 13 includes a data shift register 31 and CR bus access logic unit 30. The shift register 31 is also illustrated in FIG. 2 and is configured as a 42-bit shift register. The lower most 32 bits are designated as data bits and form the data component 32. Bits 32–40 are designated as address bits (address component 33) and the most significant bit (component 34) is used to designate a write or a read operation (W/R#).

When the TDI signal is providing address, W/R# and data information, the serial bits are routed to and loaded into the data shift register 31. When all 42 bits have been serially loaded into register 31, register 31 transfers the 32-bit data information onto bus 15 and the 9-bit address along with the single W/R# bit onto bus 16 as parallel transfers under control of CR bus access logic unit 30. The timing is a design choice, but generally address access is achieved first followed by the data access. The type of access (be it a read or a write operation) depends on the status of the W/R# bit. As noted earlier, the data is placed on data bus 15, while the address and W/R# status are placed on address and W/R# bus 16. In a write operation data is written into one of the registers 14 from register 31. In a read operation data is read from one of the registers 14 to register 31. In the preferred embodiment, buses 15 and 16 are clocked at different times in order to effect the access and data transfer.

The CR bus access logic unit 30 has a responsibility of arbitrating the access of CR buses 15 and 16. Since this operation is for testing, the CRU 13 allows TAP access over any microcode instruction accessing or attempting to access bus 15 or 16. Generally, the normal operation of the microcode is interrupted or suspended if a conflict arises when the CRU 13 arbitrates an access onto bus 15 or 16. This is controlled by the bus access logic 30.

In the operation of the preferred embodiment, if a TAP access is a write operation to one of the registers 14, a single TAP operation is required. Once the address and data information have been shifted in to register 31, a single operation is needed to access the appropriate register 14 and to write the data into it. If the TAP access is a read operation, then two separate operations are needed, a first operation to access (read) the desired register 14 and a second operation to serially output the data from register 31. Thus, during the first operation, the parallel data is loaded into the data register 31 and during the second operation, the data is then serially shifted out as an input to mux 23 and as an output signal TDO from mux 23.

In the preferred embodiment two different TAP instructions, CRBUS and CRBUSNOGO, have been designed to perform the necessary accessing of CRs 14. These two instructions are coupled to the instruction register 21 as TDI signals. The CRBUS command instructs the TAP to access the appropriate location and if it is a "write," to write the data 32 to the accessed register 14. If the operation is a "read," then the CRBUS command instructs data to be read from the accessed register 14 to register 31 as data 32. The CRBUSNOGO instruction is used (along with the CRBUS instruction) only for a read operation. During a read operation the CRBUS command accesses the appropriate register 14 and reads data into register 31. When the CRBUSNOGO instruction is received and executed later, the information is serially shifted out from the shift register 31 through mux 23 and out as a serial TDO signal.

It is appreciated from the above description that the present invention allows for a low level access to a functional bus internal to the microprocessor. That is, low level buses of this type have generally not been available for access by external means. This technique will allow access to the control register bus and the control registers of a microprocessor to perform testing and diagnostics (including debug) without invoking microcode execution, Additionally, this access is achieved at full processor speed. Thus, this technique allows for relatively non-intrusive inspection and modification of internal microarchitecture states, including the ability to test and debug while the microprocessor is operating normally. Additionally, the TAP access can be readily configured with minimal design change to accept some public access to the control registers by specifying within the microprocessor (such as in the instruction decode control logic unit 22) which public instructions (for example, those instructions specified in the IEEE 1149.1 standard) can be allowed to execute. Private instructions (those instructions proprietary to the manufacturer of the particular processor) can still be executed to test and debug the microprocessor, but would not be available to the general user.

Other advantages of the present invention are noted herein as well. Access to the CR buses 15 and 16 without the need to run microcode allows inspection and modification of micro architectural structures which are implicitly used in the execution of microcode sequences. Instead of designing in preselected microcode, simple TAP commands permit input of instructions from external sources. Also, serial access to an internal parallel data path adds less impact to the routing area (and thus die size need not be increased to accommodate parallel data input), decreases the loading on internal buses, and reduces system requirements for extra pins and parallel logic to support the access mode. Use of an existing serial port which conforms to an industry standard eliminates the need to invent custom protocols. If the device already has a TAP support logic, then these input pins can be used for providing the interface. It also allows existing tools and hardware which interface to the industry standard port to be used (with extensions) for the new feature. Furthermore, concatenation of data and address in the same serial stream for later sequencing onto separate buses reduces the overhead for submitting an access to the serial port.

Thus, a scheme for accessing internal data path by use of an industry standard test access port is described. It is noted that the present invention is implemented in a microprocessor, particularly a microprocessor manufactured by Intel Corporation. However, it is appreciated that the present invention can be implemented in other microprocessors and integrated circuits as well without departing from the spirit and scope of the present invention.

We claim:

1. A microprocessor providing external diagnostic access comprising:

a plurality of control registers;

an internal bus coupled to said control registers;

a test access port (TAP) configured to receive external programming signals in a serial format;

said TAP including a first register that receives a first instruction command in said serial format and converts said first instruction command to a parallel format;

a control register unit that receives, in said serial format, an address to one of said control registers for data access thereto, said control register unit being coupled to said TAP and said internal bus;

said control register unit including a second register that converts data received in said serial format to said parallel format;

in a write operation, said control register unit causing data to be transferred from said second register to said one of said control registers specified by said address responsive to said first instruction command;

in a read operation, said control register unit causing data to be transferred from said one of said control registers to said second register responsive to said first instruction command.

2. The microprocessor of claim 1 wherein said control register unit further includes a bus access logic unit that arbitrates for said internal bus to enable data transfer between said second register and said one of said control registers.

3. The microprocessor of claim 2 wherein said TAP further includes a decode and control logic unit that decodes said first instruction command and that generates a control signal to said control register unit.

4. The microprocessor of claim 3 wherein said TAP further includes a finite state controller that generates test access port control signals to said first register and said decode and control logic unit.

5. The microprocessor of claim 4 wherein said internal bus comprises a data bus and an address bus.

6. The microprocessor of claim 5 wherein said TAP is configured to operate in accordance with a signaling protocol.

7. In a microprocessor having a plurality of control registers coupled to an internal bus, and a test access port (TAP), a method of providing external, diagnostic access to said control registers comprising the steps of:

receiving external programming signals in a serial format at said test access port;

coupling an instruction command in said serial format to a first shift register in said TAP;

converting said instruction command to a parallel format;

generating a control signal based on said instruction command;

coupling serial information which includes an address, for accessing one of said control registers, to a second shift register of a control register unit for data transfer to or from said one of said control registers;

converting said serial information to said parallel format;

executing a write or read operation to access an addressed control register for data transfer;

converting read data to said serial format for output if said data transfer is from one of said control registers to said second shift register.

8. The method of claim 7 further including the step of arbitrating for access of said internal bus prior to executing said write or read operation, wherein said access takes priority over microcode execution.

9. The method of claim 8 wherein said step of coupling serial information also conveys information identifying if a particular access is a read or a write operation.

10. The method of claim 9 wherein said step of configuring said TAP also includes configuring said TAP to operate in accordance with a signaling protocol.

* * * * *